US010128202B2

(12) United States Patent
Li et al.

(10) Patent No.: US 10,128,202 B2
(45) Date of Patent: Nov. 13, 2018

(54) ELECTROSTATIC PROTECTION STRUCTURE, ARRAY SUBSTRATE AND DISPLAY DEVICE

(71) Applicant: BOE TECHNOLOGY GROUP CO., LTD., Beijing (CN)

(72) Inventors: Pan Li, Beijing (CN); Hongfei Cheng, Beijing (CN); Yong Qiao, Beijing (CN); Jian Xu, Beijing (CN); Yongda Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/537,049

(22) PCT Filed: Aug. 26, 2016

(86) PCT No.: PCT/CN2016/096885
§ 371 (c)(1),
(2) Date: Jun. 16, 2017

(87) PCT Pub. No.: WO2017/166637
PCT Pub. Date: Oct. 5, 2017

(65) Prior Publication Data
US 2018/0096956 A1 Apr. 5, 2018

(30) Foreign Application Priority Data

Mar. 30, 2016 (CN) .................... 2016 2 0257026 U

(51) Int. Cl.
*H01L 27/085* (2006.01)
*H01L 23/60* (2006.01)
*H01L 27/12* (2006.01)

(52) U.S. Cl.
CPC .............. *H01L 23/60* (2013.01); *H01L 27/12* (2013.01)

(58) Field of Classification Search
None
See application file for complete search history.

(56) References Cited

U.S. PATENT DOCUMENTS

2004/0195584 A1* 10/2004 Hembree ................. G01R 1/18
257/173
2007/0284578 A1* 12/2007 Yoon ..................... G02F 1/1362
257/48

(Continued)

FOREIGN PATENT DOCUMENTS

CN 1747099 A 3/2006
CN 1933013 A 3/2007

(Continued)

OTHER PUBLICATIONS

International Search Report dated Jan. 4, 2017.

*Primary Examiner* — Sitaramarao S Yechuri
(74) *Attorney, Agent, or Firm* — Dilworth & Barrese, LLP.; Michael J. Musella, Esq.

(57) ABSTRACT

Disclosed are an electrostatic protection structure, array substrate and display device. The electrostatic protection structure includes a first electrostatic protection unit and a second electrostatic protection unit which are disposed in sequence. One end of the first electrostatic protection unit is connected with a first electrostatic beginning end, and another end of the first electrostatic protection unit is connected with an electrostatic discharge end; the second electrostatic protection unit includes a first conduction structure, of which one end is connected with a second electrostatic beginning end and another end is connected with an electrostatic terminating end. The second electrostatic beginning end is a outflow end for static electricity, the first conduction structure is configured to disconnect from the second elec- (Continued)

trostatic beginning end and/or said electrostatic terminating end when static electricity passes the first conduction structure.

19 Claims, 3 Drawing Sheets

(56) References Cited

U.S. PATENT DOCUMENTS

| | | | |
|---|---|---|---|
| 2008/0259009 A1* | 10/2008 | Gao | G09G 3/3611 345/87 |
| 2009/0072232 A1* | 3/2009 | Hayashi | H01L 21/28202 257/43 |
| 2013/0062607 A1* | 3/2013 | Yamazaki | H01L 27/1225 257/59 |
| 2015/0241744 A1* | 8/2015 | Nakata | H01L 27/0296 349/42 |

FOREIGN PATENT DOCUMENTS

| | | |
|---|---|---|
| CN | 101290408 A | 10/2008 |
| CN | 103441119 A | 12/2013 |
| CN | 103943611 A | 7/2014 |
| CN | 205452280 U | 8/2016 |

* cited by examiner

ELECTROSTATIC PROTECTION STRUCTURE, ARRAY SUBSTRATE AND DISPLAY DEVICE

TECHNICAL FIELD

Embodiments of the present disclosure relate to an electrostatic protection structure, an array substrate and a display device.

BACKGROUND

At present, with the continuous improvements of people's living standard, applications of display products are more and more popular, and people propose higher and higher quality requirements on display products. However, display products are often influenced by static electricity in production, transportation and operation, thereby adversely influencing the quality of display products.

A common electrostatic discharge (ESD) protection structure cannot completely prevent electrostatic discharge (ESD) of display panel from occurring. If the display panel experiences electrostatic discharge (ESD), the common electrostatic discharge (ESD) protection structure is broken down, and electrostatic discharge (ESD) will damage the driving IC through signal lines, so as to further influence the display of the entire display panel.

SUMMARY

The present disclosure provides an electrostatic protection structure, an array substrate and a display device. The electrostatic protection structure can effectively prevent static electricity from damaging subsequent circuits after the common electrostatic discharge (ESD) protection circuit is broken down.

At least one embodiment of the present disclosure provides an electrostatic protection structure, which comprises a first electrostatic protection unit having one end connected with a first electrostatic beginning end, and another end connected with an electrostatic discharge end for conducting static electricity generated by the first electrostatic beginning end to the electrostatic discharge end; and a second electrostatic protection unit comprising a first conduction structure of which one end is connected with a second electrostatic beginning end and another end is connected with an electrostatic terminating end, wherein the first electrostatic protection unit and the second electrostatic protection unit are disposed in sequence, the second electrostatic beginning end is a outflow end for static electricity when the first electrostatic protection unit fails to conduct static electricity generated at the first electrostatic beginning end to the electrostatic discharge end, the first conduction structure is configured to disconnect from the second electrostatic beginning end and/or said electrostatic terminating end when static electricity passes the first conduction structure.

For example, in the electrostatic protection structure provided by an embodiment of the present disclosure, the first electrostatic beginning end is a gate line/data line.

For example, in the electrostatic protection structure provided by an embodiment of the present disclosure, the second electrostatic beginning end is a gate line/data line or a lead of the gate line/data line.

For example, in the electrostatic protection structure provided by an embodiment of the present disclosure, the electrostatic discharge end is a short-circuit ring.

For example, in the electrostatic protection structure provided by an embodiment of the present disclosure, the electrostatic terminating end is a lead of a gate line/data line or a lead of a preset driving circuit board.

For example, in the electrostatic protection structure provided by an embodiment of the present disclosure, the first conduction structure is a part of the gate line or data line, the gate line or data line corresponding to the first conduction structure has a width smaller than that of the gate line or data line not corresponding to the first conduction structure.

For example, in the electrostatic protection structure provided by an embodiment of the present disclosure, the gate line or data line corresponding to the first conduction structure has a width that is 5%-20% of a width of the gate line or data line not corresponding to the first conduction structure.

For example, in the electrostatic protection structure provided by an embodiment of the present disclosure, the first conduction structure is one made of a high resistance or low melting point material that satisfies electrostatic fuse condition.

For example, in the electrostatic protection structure provided by an embodiment of the present disclosure, the first conduction structure comprises a transparent conduction layer that is connected with the second electrostatic beginning end and the electrostatic terminating end through vias.

For example, in the electrostatic protection structure provided by an embodiment of the present disclosure, the second electrostatic beginning end is a lead of a gate line/data line; the electrostatic terminating end is a lead of a preset driving circuit board, and the first conduction structure is disposed in a bonding region between the lead of the gate line/data line and the preset driving circuit board.

For example, in the electrostatic protection structure provided by an embodiment of the present disclosure, the second electrostatic protection unit further comprises a repair structure that comprises at least one repair line; the repair line has one end lapped at the second electrostatic beginning end but not electrically connected with the second electrostatic beginning end, and another end connected with a preset circuit interface.

For example, in the electrostatic protection structure provided by an embodiment of the present disclosure, the second electrostatic protection unit further comprises a repair structure that comprises at least one repair line; the repair line has one end lapped at the second electrostatic beginning end and another end lapped at the electrostatic terminating end, and the repair line is not electrically connected with the second electrostatic beginning end and the electrostatic terminating end.

At least one embodiment of the present disclosure provides an array substrate, comprising at least one abovementioned electrostatic protection structure.

At least one embodiment of the present disclosure provides a display device, comprising any one of the abovementioned array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention; for one skilled person in the art, other drawings can be obtained according to these drawings without any inventive work.

DETAILED DESCRIPTION

Figure 1:
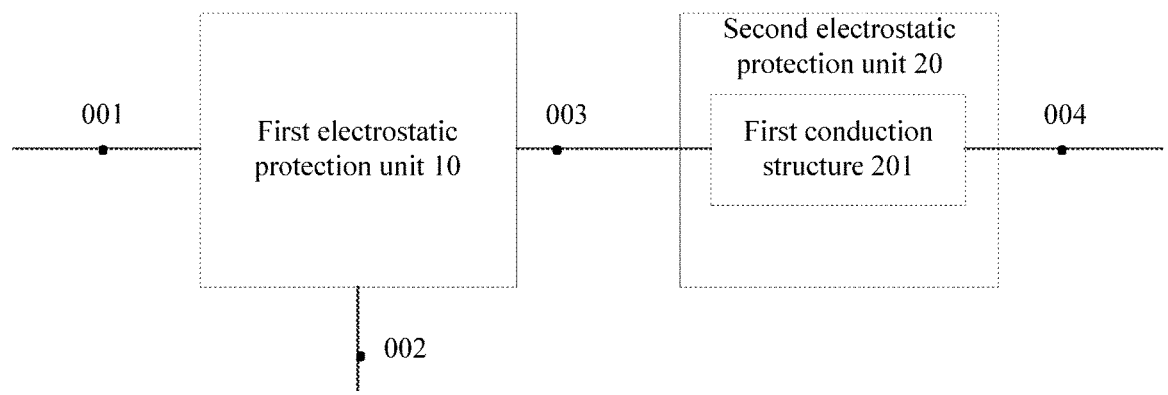
FIG. 1 is a structural schematic diagram of an electrostatic protection structure provided in an embodiment of the present disclosure.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the disclosure. Based on the described embodiments herein, one person skilled in the art can obtain other embodiment(s), without any inventive work, which should be within the scope of the present disclosure. Besides, shapes and sizes of parts in accompanying drawings do not reflect the real proportion of the display device and only illustrate contents of the present disclosure.

Unless otherwise defined, all the technical and scientific terms used herein have the same meanings as commonly understood by one of ordinary skill in the art to which the present invention belongs. The terms "first," "second," and so on which are used in the description and the claims of the present application for invention, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Embodiments of the present disclosure provide an electrostatic protection structure, an array substrate and a display device. The electrostatic protection structure includes a first electrostatic protection unit and a second electrostatic protection unit disposed in sequence. One end of the first electrostatic protection unit is connected with a first electrostatic beginning end, and another end is connected with a electrostatic discharge end for conducting static electricity generated by the first electrostatic beginning end to the electrostatic discharge end. The second electrostatic protection unit includes a first conduction structure of which one end is connected with the second electrostatic beginning end and another end is connected with a electrostatic terminating end. The second electrostatic beginning end is the outflow end of static electricity when the first electrostatic protection unit fails to conduct the static electricity generated at the first electrostatic beginning end to the electrostatic discharge end, and the first conduction structure is configured to disconnect from the second electrostatic beginning end and/or the electrostatic terminating end when static electricity passes the first conduction structure. The electrostatic protection structure can effectively prevent static electricity from damaging subsequent circuits after the common electrostatic discharge (ESD) protection circuit is broken down.

Hereafter, the electrostatic protection structure, the array substrate and the display device provided in embodiments of the present disclosure will be described below with reference to accompanying drawings.

First Embodiment

FIG. 1 is a structural schematic diagram of an electrostatic protection structure provided in the present embodiment. As shown in FIG. 1, the electrostatic protection structure provided in the present embodiment includes: a first electrostatic protection unit 10 and a second electrostatic protection unit 20, which are disposed in sequence; in which the first electrostatic protection unit 10 has one end connected with a first electrostatic beginning end 001 and another end connected with an electrostatic discharge end 002 for conducting static electricity generated by the first electrostatic beginning end 001 to the electrostatic discharge end 002; and the second electrostatic protection unit 20 includes a first conduction structure 201 having one end connected with a second electrostatic beginning end 003 and another end connected with an electrostatic terminating end 004; the second electrostatic beginning end 003 is the outflow end of static electricity when the first electrostatic protection unit 10 fails to conduct static electricity generated by the first electrostatic beginning end 001 to the electrostatic discharge end 002; and the first conduction structure 201 is configured to disconnect from the second electrostatic beginning end 003 and/or the electrostatic terminating end 004 when static electricity passes the first conduction structure.

In this embodiment, the above-mentioned first electrostatic protection unit may have multiple options such as a common electrostatic discharge (ESD) protection circuit, which is not described in detail here.

In the electrostatic protection structure provided in the present embodiment, on the basis of the first electrostatic protection unit, a second electrostatic protection unit having auxiliary function is provided to function like a fuse after the first electrostatic protection unit fails to discharge static electricity. That is, when static electricity passes the defense line of the first electrostatic protection unit and enters the second electrostatic protection unit, the second electrostatic protection unit disconnects from the second electrostatic beginning end and the electrostatic terminating end to avoid damage to subsequent circuits connected with electrostatic terminating end by the static electricity. For example, when the electrostatic terminating end is connected with the driving circuit of the display panel, the second electrostatic protection unit may function to prevent the generated static electricity from causing more damage to the driving circuit when the first electrostatic protection unit fails to discharge static electricity.

For example, in the electrostatic protection structure provided in an example of the present embodiment, the first electrostatic beginning end 001 is a gate line or a data line. Accordingly, the second electrostatic beginning end 003 is also a gate line/data line or a lead of the gate line/data line.

For example, in the electrostatic protection structure provided in an example of the present embodiment, the electrostatic discharge end 002 is a short-circuit ring.

For example, in the electrostatic protection structure provided in an example of the present embodiment, the electrostatic terminating end 004 is a lead of a gate line/data line or a lead of a preset driving circuit board.

Second Embodiment

The present embodiment provides an electrostatic protection structure. The first electrostatic beginning end of the electrostatic protection structure is a gate line or a data line, and the second electrostatic beginning end is also a gate line or a data line, the first conduction structure 201 is a part of a gate line or a data line, and the gate line or data line corresponding to the first conduction structure 201 has a width smaller than that of the gate line or data line not corresponding to the first conduction structure 201.

Figure 2:
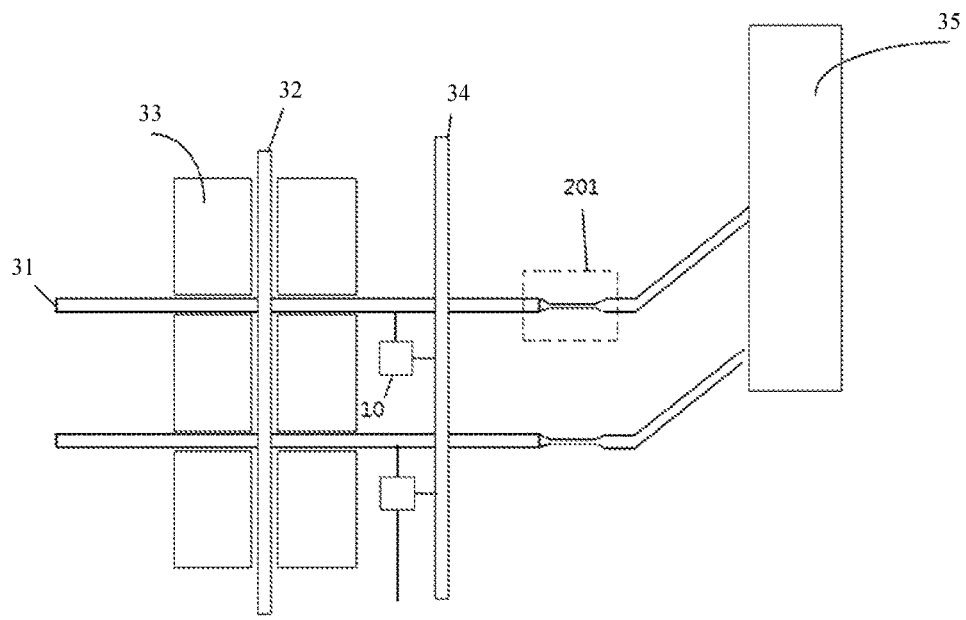
FIG. 2 is a structural schematic diagram of another electrostatic protection structure provided in an embodiment of the present disclosure.

For example, as shown in FIG. 2, the gate line 31 and the data line 32 are arranged in a crossing manner and define a plurality of pixel units 33. The first electrostatic protection unit 10 connects the gate line 31 with the short-circuit ring 34 to conduct static electricity on the gate line 31 to the short-circuit ring 34 for discharging. The first electrostatic beginning end 001 is a gate line, the second electrostatic beginning end 003 is also a gate line, and the electrostatic discharge end 002 is a short-circuit ring. As can be seen from FIG. 2, the first conduction structure 201 is a part of the gate line, and the width of the gate line corresponding to the first conduction structure 201 is smaller than that of the gate line not corresponding to the first conduction structure 301. The width range of the gate line corresponding to the first conduction structure 201 can guarantee that the first conduction structure 201 will fuse automatically when there is static electricity passing the first conduction structure 201. That is, the first conduction structure is a gate line with reduced width or radius. By reducing the width or radius of the gate line at the location of the first conduction structure, when static electricity passes the gate line with reduced width or radius, the gate line with reduced width or radius fuses to guarantee that subsequent other circuits or structures will not be damaged by the static electricity.

For example, in the electrostatic protection structure provided in an example of the present embodiment, the gate line corresponding to the first conduction structure has a width which is 5%-20% of that of the gate line not corresponding to the first conduction structure.

For example, in the electrostatic protection structure provided in an example of the present embodiment, as shown in FIG. 2, a first electrostatic protection unit 10 is connected between the gate line 31 and the short-circuit ring 34 (for example, the first electrostatic protection unit 10 may be a common electrostatic discharge (ESD) protection circuit), the short-circuit ring 34 is electrically connected with a periphery common electrode, and the gate line 31 is connected with the first electrostatic protection unit 10 and then with the first conduction structure 201, and finally led to the driving IC 35 (driving circuit). The width of the first conduction structure 201 is reduced to between 1/5~1/20 of the original width of the gate line. After the first electrostatic protection unit 10 is broken down by static electricity, the static electricity flows through the first conduction structure 201. Due to the reduced width, the first conduction structure 201 finally fuse due to the instant accumulation of electric charges, and static electricity can not further propagate to the driving IC. In addition, the same structure can also be formed in the data line leading out region, which will not be described in detail here.

In this embodiment, the segment of gate line with reduced width is used as the above-mentioned first conduction structure. When the first electrostatic protection unit fails to discharge static electricity, the static electricity passes the first conduction structure. Since the first conduction structure is a gate line with reduced width, the first conduction structure will fuse immediately to prevent the static electricity from causing more damage to subsequent driving IC (35 in the figure).

Third Embodiment

The present embodiment provides an electrostatic protection structure in which the first conduction structure is a signal line with reduced width. Of course, the specific implementation of the first conduction structure is not limited thereto. For example, it may also be other structure that can fuse automatically while static electricity flows through it. For example, in this embodiment, the first conduction structure is one made of a high resistance or low melting point material that satisfies electrostatic fuse condition. That is, the first conduction structure may be one made of a high resistance or low melting point material and the high resistance or low melting point material can fuse while static electricity passes.

Fourth Embodiment

The present embodiment provides an electrostatic protection structure in which the first conduction structure includes a transparent conduction layer that is connected with the second electrostatic beginning end and the electrostatic terminating end through vias.

Figure 3:
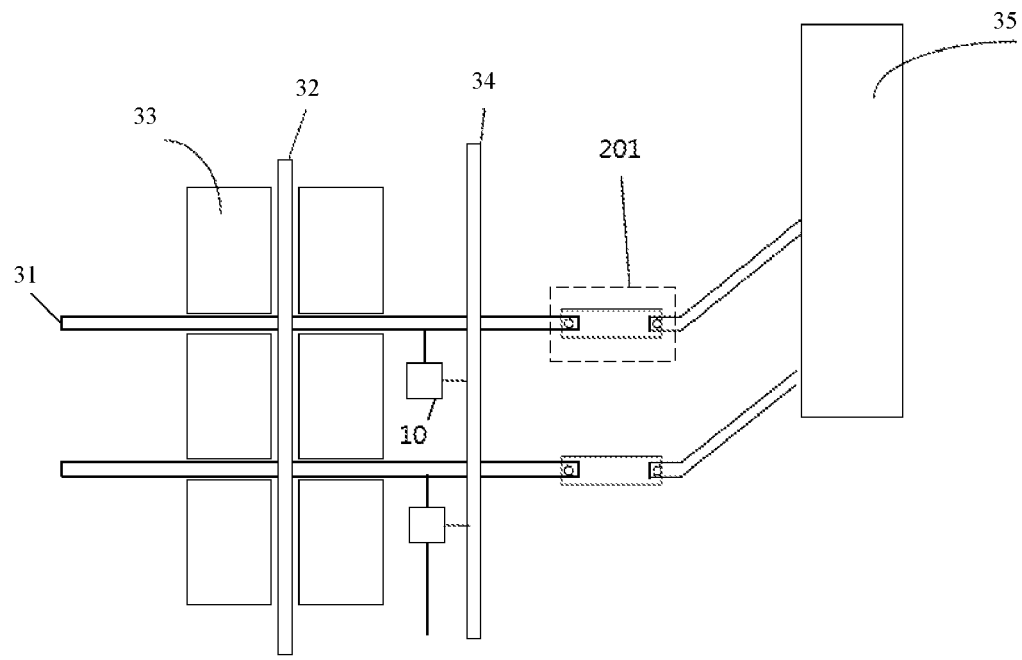
FIG. 3 is a structural schematic diagram of another electrostatic protection structure provided in an embodiment of the present disclosure.

For example, as shown in FIG. 3, a first electrostatic protection unit 10 (which may be a common electrostatic discharge (ESD) protection circuit) is connected between a gate line 31 and a short-circuit ring 34 that is electrically connected with a periphery common electrode, and the gate line 31 is connected after the first electrostatic protection unit 10 and then with the first conduction structure 201, and finally led to over the driving IC 35 (driving circuit). The first conduction structure 201 is a strip-like transparent conduction layer connected to the gate line and the lead of the gate line respectively through vias. That is, the strip-like transparent conduction layer has one end connected with the gate line through a via and another end connected with the lead of the gate line through a via. Since the strip-like transparent conduction layer is prone to be broken down by static electricity, it can also prevent the static electricity from propagating furthermore.

Fifth Embodiment

The present embodiment provides an electrostatic protection structure which mainly relates to the position arrangement of the first conduction structure.

For example, in the electrostatic protection structure provided in an example of the present embodiment, the second electrostatic beginning end is a lead of a gate line/data line. Accordingly, the electrostatic terminating end is the lead of a preset driving circuit board, and the first conduction structure is arranged in the bonding region between the lead of the gate line/data line and the preset driving circuit board.

Figure 4:
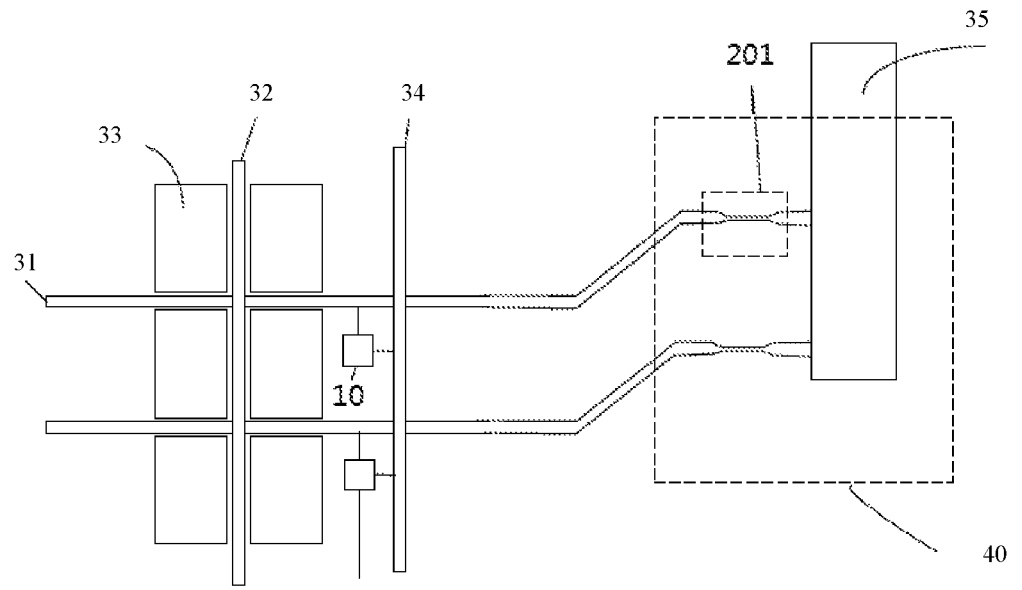
FIG. 4 is a structural schematic diagram of another electrostatic protection structure provided in an embodiment of the present disclosure.

For example, as shown in FIG. 4, A first electrostatic protection unit 10 (which may be a common electrostatic discharge (ESD) protection circuit) is connected between a gate line 31 and a short-circuit ring 34 that is electrically connected with a periphery common electrode, and the gate line 31 is connected with the first electrostatic protection unit 10 and then with the lead of the gate line that is connected with the first conduction structure 201 in the bonding region 40 between the lead of the gate line and the driving IC 35. The first conduction structure 201 of the present embodiment may be any form of the aforementioned embodiment. The first conduction structure 201 is placed in the bonding region which further facilitates repairing it and prevents defectiveness from occurring. When the first conduction structure is broken down by static electricity, it is possible to repair or replace the first conduction structure conveniently.

Sixth Embodiment

The present embodiment provides an electrostatic protection structure. In this embodiment, in addition to the first conduction structure, the second electrostatic protection unit further includes a repair structure that includes at least one repair line. The repair line has one end lapped at the second electrostatic beginning end but not electrically connected with the second electrostatic beginning end, and another end connected with a preset circuit interface. For example, the preset circuit interface is a certain pin of the driving IC.

Figure 5:
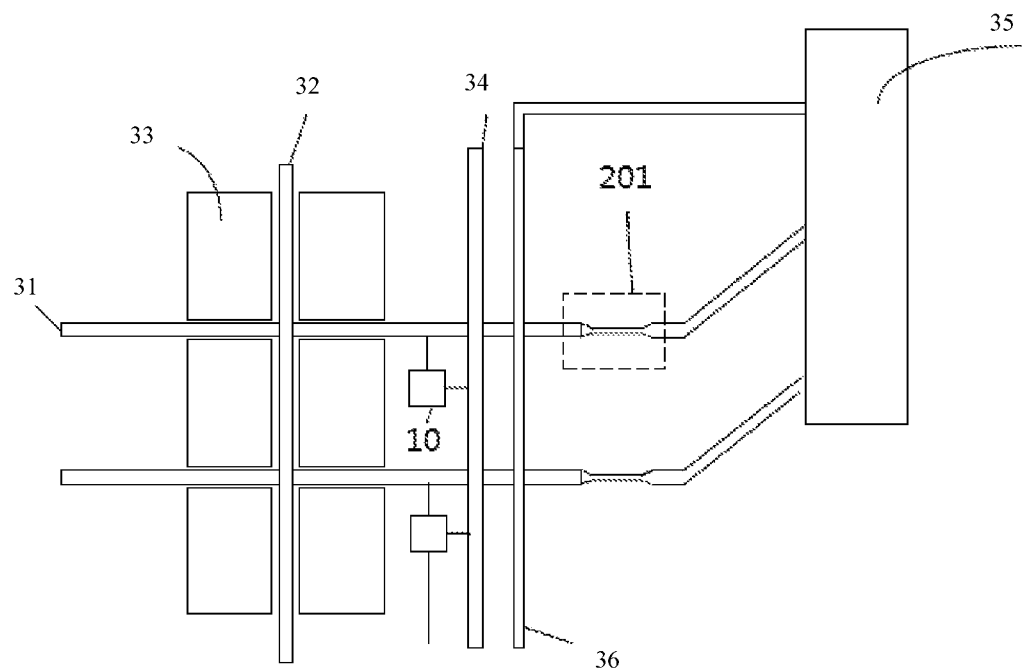
FIG. 5 is a structural schematic diagram of another electrostatic protection structure provided in an embodiment of the present disclosure.

For example, as shown in FIG. 5, as an improvement to the above-mentioned embodiment, in the present embodiment, a repair line 36 is added at the inner side of the first conduction structure 201 which is disposed on a metal layer different from the gate line metal layer. The repair line has one end lapped on all the gate lines (said lapping means that the normal projections of the repair line and the gate lines on the plane where the gate lines and the data lines are located overlap but not electrically connected), and the other end connected with a pin of the driving IC 35. After the first conduction structure 201 is broken (fused), it is possible to weld the gate line and the repair line with laser to address display defectiveness such as bright lines caused after the electrostatic discharge (ESD) damages the first conduction structure 201.

For example, in the electrostatic protection structure provided in an example of the present embodiment, there may be a plurality of repair lines that may repair a plurality of damaged gate lines at the same time. The positions of repair lines are arbitrary positions between the display area and the first conduction structure 201.

Seventh Embodiment

The present embodiment provides an electrostatic protection structure. In this embodiment, in addition to the first conduction structure, the second electrostatic protection unit further includes a repair structure that includes at least one repair line. The repair line has one end lapped at the second electrostatic beginning end and another end lapped at the electrostatic terminating end, and the repair line is not electrically connected with the second electrostatic beginning end and the electrostatic terminating end. The present embodiment and the above-mentioned embodiment are different in that the other end of the repair line does not interface with the preset circuit but is lapped with the electrostatic terminating end.

Figure 6:
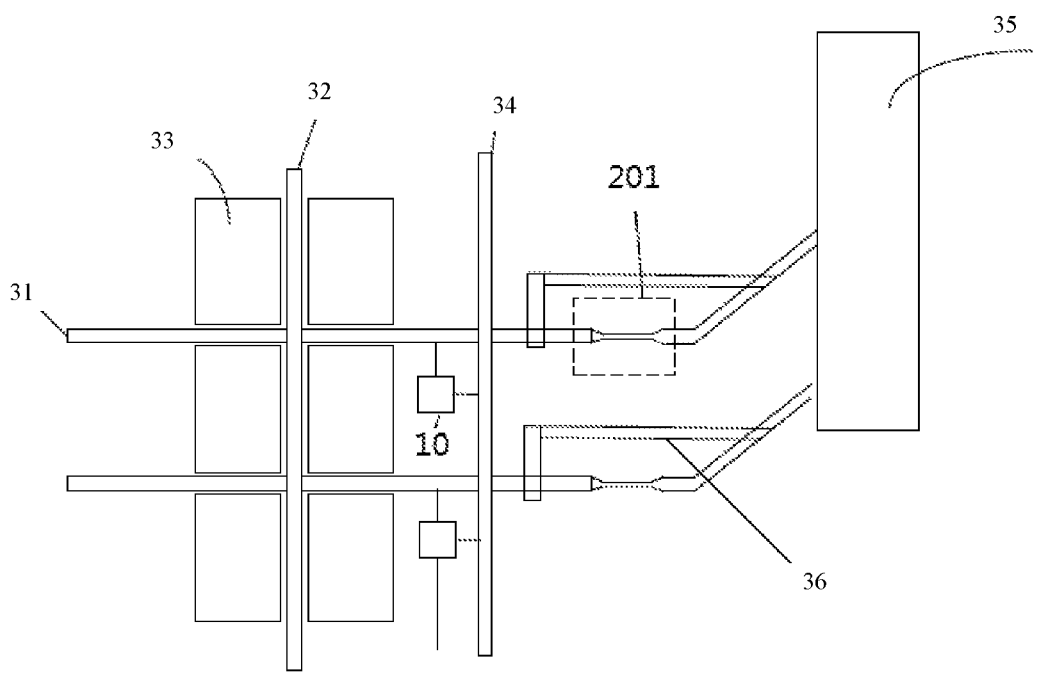
FIG. 6 is a structural schematic diagram of another electrostatic protection structure provided in an embodiment of the present disclosure.

For example, as shown in FIG. 6, in the present embodiment, a repair line 36 is added at outer side of each of the first conduction structure 201 which is a metal layer different from the gate line metal layer. Two ends of the repair line are lapped on the gate line (the second electrostatic beginning end) and the lead of the gate line (electrostatic terminating end) respectively and are not electrically connected with the gate line and the lead of the gate line. After the first conduction structure 201 is broken by static electricity, it is possible to weld the gate line and the repair line with laser to address display defectiveness such as bright lines caused after the electrostatic discharge (ESD) damages the first conduction structure 201.

All the above embodiments have been described with respect of gate lines and leads thereof as an example. However, the present disclosure is not limited to gate lines, and data lines and other signal lines are equally applicable to the present disclosure and covered by the present disclosure.

Eighth Embodiment

The present embodiment provides an array substrate including at least one electrostatic protection structure as described in any of the above-mentioned embodiments.

Since the array substrate of the present embodiment contains the electrostatic protection structure provided in the above-mentioned embodiment, it has a high capability of preventing electrostatic damage and therefore can effectively prolong the service life and guarantee the display quality of the display device.

Ninth Embodiment

The present embodiment provides a display device including the array substrate of the above embodiment.

Since the display device of the present embodiment contains the electrostatic protection structure provided in the above-mentioned embodiment, it has a high capability of preventing electrostatic damage and therefore can effectively prolong the service life and guarantee the display quality of the display device.

For example, the display device of the present embodiment may be applied in products with display function such as mobile telephones, tablet computers, video cameras, cameras, TV sets and printers.

The above are only specific implementations of the present invention. However the scope of the present invention is not limited thereto. Variations or substitutions that easily occur to any one skilled in the art within the technical scope disclosed in the present invention should be encompassed in the scope of the present invention. Therefore, the scope of the present disclosure should be based on the scope of the claims.

The present application claims priority of China Patent application No. 201620257026.9 filed on Mar. 30, 2016, the content of which is incorporated in its entirety as part of the present application by reference herein.

What is claimed is:

1. An electrostatic protection structure, comprising:
   a first electrostatic protection unit having one end connected with a first electrostatic beginning end, and another end connected with an electrostatic discharge end for conducting static electricity generated by the first electrostatic beginning end to the electrostatic discharge end; and
   a second electrostatic protection unit comprising a first conduction structure of which one end is connected with a second electrostatic beginning end and another end is connected with an electrostatic terminating end,
   wherein the first electrostatic protection unit and the second electrostatic protection unit are disposed in sequence, the second electrostatic beginning end is a outflow end for static electricity when the first electrostatic protection unit fails to conduct static electricity generated at the first electrostatic beginning end to the electrostatic discharge end, the first conduction structure is configured to disconnect from the second electrostatic beginning end and/or said electrostatic terminating end when static electricity passes the first conduction structure,
   the first electrostatic beginning end is a gate line/date line, the second electrostatic beginning end is a gate line/data line or a lead of the gate line/data line,
   the second electrostatic beginning end is a lead of a gate line/data line; the electrostatic terminating end is a lead of a preset driving circuit board, and the first conduction structure is disposed in a bonding region between the lead of the gate line/data line and the preset driving circuit board.

2. An array substrate, comprising at least one electrostatic protection structure of claim 1.

3. A display device, comprising the array substrate of claim 2.

4. The electrostatic protection structure of claim 1, wherein the electrostatic discharge end is a short-circuit ring.

5. The electrostatic protection structure of claim 1, wherein the electrostatic terminating end is a lead of a gate line/data line or a lead of a preset driving circuit board.

6. The electrostatic protection structure of claim 1, wherein the first conduction structure is a part of the gate line or data line, the gate line or data line corresponding to the first conduction structure has a width smaller than that of the gate line or data line not corresponding to the first conduction structure.

7. The electrostatic protection structure of claim 6, wherein the gate line or data line corresponding to the first conduction structure has a width that is 5%-20% of a width of the gate line or data line not corresponding to the first conduction structure.

8. The electrostatic protection structure of claim 1, wherein the first conduction structure is one made of a high resistance or low melting point material that satisfies electrostatic fuse condition.

9. The electrostatic protection structure of claim 1, wherein the first conduction structure comprises a transparent conduction layer that is connected with the second electrostatic beginning end and the electrostatic terminating end through vias.

10. An electrostatic protection structure, comprising:
a first electrostatic protection unit having one end connected with a first electrostatic beginning end, and another end connected with an electrostatic discharge end for conducting static electricity generated by the first electrostatic beginning end to the electrostatic discharge end; and
a second electrostatic protection unit comprising a first conduction structure of which one end is connected with a second electrostatic beginning end and another end is connected with an electrostatic terminating end,
wherein the first electrostatic protection unit and the second electrostatic protection unit are disposed in sequence, the second electrostatic beginning end is a outflow end for static electricity when the first electrostatic protection unit fails to conduct static electricity generated at the first electrostatic beginning end to the electrostatic discharge end, the first conduction structure is configured to disconnect from the second electrostatic beginning end and/or said electrostatic terminating end when static electricity passes the first conduction structure,
the second electrostatic protection unit further comprises a repair structure that comprises at least one repair line;
the repair line has one end lapped at the second electrostatic beginning end but not electrically connected with the second electrostatic beginning end, and another end connected with a preset circuit interface.

11. The electrostatic protection structure of claim 10, wherein the first electrostatic beginning end is a gate line/data line.

12. The electrostatic protection structure of claim. 11, wherein the second electrostatic beginning end is a gate line/data line or a lead of the gate line/data line.

13. The electrostatic protection structure of claim 10, wherein the first conduction structure is a part of the gate line or data line, the gate line or data line corresponding to the first conduction structure has a width smaller than that of the gate line or data line not corresponding to the first conduction structure.

14. The electrostatic protection structure of claim 13, wherein the gate line or data line corresponding to the first conduction structure has a width that is 5%-20% of a width of the gate line or data line not corresponding to the first conduction structure.

15. The electrostatic protection structure of claim 10, wherein the first conduction structure comprises a transparent conduction layer that is connected with the second electrostatic beginning end and the electrostatic terminating end through vias.

16. An electrostatic protection structure, comprising:
a first electrostatic protection unit having one end connected with a first electrostatic beginning end, and another end connected with an electrostatic discharge end for conducting static electricity generated by the first electrostatic beginning end to the electrostatic discharge end; and
a second electrostatic protection unit comprising a first conduction structure of which one end is connected with a second electrostatic beginning end and another end is connected with an electrostatic terminating end,
wherein the first electrostatic protection unit and the second electrostatic protection unit are disposed in sequence, the second electrostatic beginning end is a outflow end for static electricity when the first electrostatic protection unit fails to conduct static electricity generated at the first electrostatic beginning end to the electrostatic discharge end, the first conduction structure is configured to disconnect from the second electrostatic beginning end and/or said electrostatic terminating end when static electricity passes the first conduction structure,
the second electrostatic protection unit further comprises a repair structure that comprises at least one repair line;
the repair line has one end lapped at the second electrostatic beginning end and another end lapped at the electrostatic terminating end, and the repair line is not electrically connected with the second electrostatic beginning end and the electrostatic terminating end.

17. The electrostatic protection structure of claim 16, wherein the first conduction structure is a part of the gate line or data line, the gate line or data line corresponding to the first conduction structure has a width smaller than that of the gate line or data line not corresponding to the first conduction structure.

18. The electrostatic protection structure of claim 17, wherein the gate line or data line corresponding to the first conduction structure has a width that is 5%-20% of a width of the gate line or data line not corresponding to the first conduction structure.

19. The electrostatic protection structure of claim 16, wherein the first conduction structure comprises a transparent conduction layer that is connected with the second electrostatic beginning end and the electrostatic terminating end through vias.

* * * * *